United States Patent
Wich et al.

(10) Patent No.: US 10,128,929 B2
(45) Date of Patent: Nov. 13, 2018

(54) TRANSMITTER METHOD FOR MULTIPLE ANTENNA SYSTEMS, TRANSMITTER APPARATUS AND NETWORK NODE THEREOF

(71) Applicant: Alcatel Lucent, Boulogne Billancourt (FR)

(72) Inventors: Andreas Wich, Stuttgart (DE); Osman Aydin, Stuttgart (DE); Jakob Hoydis, Paris (FR)

(73) Assignee: ALCATEL LUCENT, Boulogne Billancourt (FR)

( * ) Notice: Subject to any disclaimer, the term of this patent is extended or adjusted under 35 U.S.C. 154(b) by 0 days.

(21) Appl. No.: 15/031,769

(22) PCT Filed: Oct. 21, 2014

(86) PCT No.: PCT/EP2014/072520
§ 371 (c)(1),
(2) Date: Apr. 25, 2016

(87) PCT Pub. No.: WO2015/062913
PCT Pub. Date: May 7, 2015

(65) Prior Publication Data
US 2016/0269092 A1    Sep. 15, 2016

(30) Foreign Application Priority Data
Oct. 29, 2013  (EP) .................................. 13190598

(51) Int. Cl.
*H04L 12/50* (2006.01)
*H04Q 11/00* (2006.01)
(Continued)

(52) U.S. Cl.
CPC ......... *H04B 7/0691* (2013.01); *H04B 7/0408* (2013.01); *H04B 7/0413* (2013.01);
(Continued)

(58) Field of Classification Search
USPC .......... 375/219, 220, 222, 240.26, 267, 260, 375/295, 299, 316, 324, 340, 346, 347,
(Continued)

(56) References Cited

U.S. PATENT DOCUMENTS

| | | | |
|---|---|---|---|
| 5,642,358 A | 6/1997 | Dent | |
| 8,193,971 B2 * | 6/2012 | Vook | H04B 17/21 342/165 |

(Continued)

FOREIGN PATENT DOCUMENTS

| | | |
|---|---|---|
| CN | 1145698 A | 3/1997 |
| CN | 101335910 A | 12/2008 |

(Continued)

OTHER PUBLICATIONS

International Search Report for PCT/EP2014/072520 dated Jan. 30, 2015.
(Continued)

*Primary Examiner* — Linda Wong
(74) *Attorney, Agent, or Firm* — Fay Sharpe LLP

(57) ABSTRACT

The embodiments of the invention relate to a transmitter method for multiple antenna systems. The transmitter method contains the step of operating at least one antenna array in a first operation mode by transmitting first transmit signals (TS1-1, TS1-*a*, TS1-A) from a first number of antenna elements (AEG1) with a first transmit power and the step of operating the at least one antenna array in at least one second operation mode by transmitting at least second transmit signals (TS2-1, TS2-*b*, TS2-B, TS3-1, TS3-C, TS3-C) from at least one second number of antenna elements (AEG2, AEG3) smaller than the first number of antenna elements with at least one second transmit power larger than the first transmit power. The embodiments of the invention further relate to a transmitter apparatus for multiple antenna
(Continued)

systems. The transmitter apparatus contains means for operating at least one antenna array in a first operation mode by transmitting first transmit signals (TS1-1, TS1-*a*, TS1-A) from a first number of antenna elements (SUB-G1) with a first transmit power and for operating the at least one antenna array in at least one second operation mode by transmitting second transmit signals (TS2-1, TS2-*b*, TS2-B, TS3-1, TS3-*c*, TS3-C) from at least one second number of antenna elements (SUB-G2, SUB-G3) smaller than the first number of antenna elements with at least one second transmit power larger than the first transmit power. The embodiments of the invention even further relate to a network node, which contains the transmitter apparatus.

14 Claims, 11 Drawing Sheets

(51) Int. Cl.

| | |
|---|---|
| *H04L 27/00* | (2006.01) |
| *H04B 7/06* | (2006.01) |
| *H04B 7/0408* | (2017.01) |
| *H04B 7/0413* | (2017.01) |
| *H04L 12/26* | (2006.01) |
| *H04B 7/0417* | (2017.01) |
| *H04B 1/04* | (2006.01) |

(52) U.S. Cl.
CPC ............ *H04L 43/16* (2013.01); *H04B 7/0417* (2013.01); *H04B 2001/0408* (2013.01)

(58) Field of Classification Search
USPC .......................... 375/317, 297; 370/357, 360
See application file for complete search history.

(56) References Cited

U.S. PATENT DOCUMENTS

| | | | | |
|---|---|---|---|---|
| 8,811,918 | B2* | 8/2014 | Rath | H04B 7/0602 |
| | | | | 455/117 |
| 2003/0006941 | A1* | 1/2003 | Ebling | H01Q 3/242 |
| | | | | 343/911 R |
| 2004/0116078 | A1* | 6/2004 | Rooyen | H04B 1/7107 |
| | | | | 455/101 |
| 2006/0084387 | A1 | 4/2006 | Difazio | |
| 2006/0223450 | A1* | 10/2006 | Dacosta | H04B 1/005 |
| | | | | 455/73 |
| 2007/0258354 | A1* | 11/2007 | Rooyen | H04B 1/7107 |
| | | | | 370/208 |
| 2008/0204349 | A1* | 8/2008 | Shtrom | H01Q 3/242 |
| | | | | 343/850 |
| 2009/0075617 | A1* | 3/2009 | Walker | H04B 7/0808 |
| | | | | 455/277.1 |
| 2010/0046671 | A1* | 2/2010 | Sadri | H04B 7/0857 |
| | | | | 375/316 |
| 2010/0117890 | A1 | 5/2010 | Vook et al. | |
| 2010/0135420 | A1* | 6/2010 | Xu | H04B 7/0413 |
| | | | | 375/260 |
| 2010/0271985 | A1* | 10/2010 | Gabriel | H01Q 1/246 |
| | | | | 370/278 |
| 2011/0159833 | A1* | 6/2011 | Kenington | H01Q 3/26 |
| | | | | 455/232.1 |
| 2012/0140658 | A1 | 6/2012 | Kanzaki et al. | |
| 2013/0143506 | A1* | 6/2013 | Catreux-Erceg | H04B 7/061 |
| | | | | 455/115.1 |
| 2013/0260708 | A1* | 10/2013 | Rofougaran | H01L 23/66 |
| | | | | 455/280 |
| 2013/0265195 | A1* | 10/2013 | Kenington | H01Q 1/246 |
| | | | | 342/368 |
| 2014/0092795 | A1* | 4/2014 | Granger-Jones | H04L 5/08 |
| | | | | 370/297 |
| 2014/0161035 | A1* | 6/2014 | Yoshida | H04W 88/06 |
| | | | | 370/328 |
| 2014/0354887 | A1* | 12/2014 | Wu | H01Q 1/525 |
| | | | | 348/706 |

FOREIGN PATENT DOCUMENTS

| | | |
|---|---|---|
| CN | 102089933 A | 6/2011 |
| JP | 2008-199463 A | 8/2008 |
| JP | 2010-251961 A | 11/2010 |
| JP | 2010-268155 A | 11/2010 |
| JP | 2012-120063 A | 6/2012 |

OTHER PUBLICATIONS

Masaaki Yamanaka et al. "A Study on Secure Wireless Links Based on Distributed Transmission Using a Secret Sharing Method—Positive and Negative Effects of Narrow Beam Creation—", Information Processing Society of Japan, The Special Interest Group Technical Reports of IPSJ, Electronic Intellectual Property, Japan, Oct. 15, 2012, No. 57, pp. 1-8.

* cited by examiner

TRANSMITTER METHOD FOR MULTIPLE ANTENNA SYSTEMS, TRANSMITTER APPARATUS AND NETWORK NODE THEREOF

FIELD OF THE INVENTION

The present invention relates to radio transmission via multiple antenna systems and, more particularly but not exclusively, to radio transmissions with different sets or groups of antenna elements.

BACKGROUND

This section introduces aspects that may be helpful in facilitating a better understanding of the invention. Accordingly, the statements of this section are to be read in this light and are not to be understood as admission about what is in the prior art.

So-called massive MIMO antenna arrays, which consist of a large number (e.g. more than 20) of antenna elements, are seen as a solution for handling the exponentially growing mobile data traffic. Each antenna element of a massive MIMO antenna array may be connected to a dedicated low power transceiver (e.g. in the double-digit milliwatt range), which provides a corresponding transmit signal to the antenna element.

On the one hand, such massive MIMO antenna arrays provide a large capacity in terms of bits/s/Hz. But on the other hand, operating each antenna element with a dedicated low power transceiver may increase the energy consumption of the massive MIMO antenna array in comparison to conventional 2×2 or 4×4 antenna arrays. Therefore, an efficient signal generation may be required in each low power transceiver. An important metric in this context is the overall energy efficiency, which may be measured for example in bit per Joule.

Even if a current data throughput is quite low, it may be necessary for the operation of the massive MIMO antenna to send a transmit signal from all the antenna elements in order to maintain a pre-configured transmission pattern (cell coverage) and to achieve a minimum signal strength at all locations of the cell coverage.

Additionally, currently intended massive MIMO deployments require a signaling cell or overlay cell in addition to a radio cell provided by the massive MIMO antenna array because the massive MIMO antenna array cannot easily be used for an attachment procedure of a mobile station due to the restriction that a radio channel to a respective mobile station has to be sounded in order for the base station to transmit a massive MIMO beam.

The overall energy efficiency of the massive MIMO antenna array is greatly reduced in low-load situations, because of the overhead energy consumption of the low power transceivers with electrically driven components such as DAC (DAC=Digital-to-Analog Converter), modulator, LO (LO=Local Oscillator), drivers, pre-amplifier, power amplifier etc. Such overhead energy consumption is usually to a wide extend independent of a current output power.

SUMMARY

Thus, an object of the embodiments of the invention is to provide solutions for maintaining a radio cell characteristic of massive MIMO antenna arrays in lower load/idle mode situations while increasing the overall energy efficiency and to propose solutions for operating an overlay radio cell or a signaling radio cell (for delivering control and signaling information and for serving a basic load) and a massive MIMO radio cell (for high load) in a cost and energy efficient way.

The object is achieved by a transmitter method for multiple antenna systems. The transmitter method contains the steps of operating at least one antenna array in a first operation mode by transmitting first transmit signals from a first number of antenna elements with a first transmit power and operating the at least one antenna array in at least one second operation mode by transmitting at least second transmit signals from at least one second number of antenna elements smaller than the first number of antenna elements with at least one second transmit power larger than the first transmit power.

The object is further achieved by a transmitter apparatus for multiple antenna systems. The transmitter apparatus contains means for operating at least one antenna array in a first operation mode by transmitting first transmit signals from a first number of antenna elements with a first transmit power and for operating the at least one antenna array in at least one second operation mode by transmitting at least second transmit signals from at least one second number of antenna elements smaller than the first number of antenna elements with at least one second transmit power larger than the first transmit power.

In embodiments, the means for operating the at least one antenna array may correspond to any operation unit, operation module, etc. Hence, in embodiments the means for operating the at least one antenna array may consist of transmitter subunits and each of the transmitter subunits may contain an input for data signals to be transmitted, several sub-units for finishing the data signals to obtain a transmit signal such as a amplitude leveling unit for a digital signal, a DAC (DAC=digital-to-analogue converter), a modulator with a local oscillator, a power amplifier, a control unit for controlling the amplitude leveling unit and/or a gain of the power amplifier, etc. and an output for the transmit signal to be applied to an antenna element or to a group of antenna elements, which are passively coupled. In some embodiments the means for operating the at least one antenna array may be partly implemented in terms of a computer program and a hardware component on which the computer program is executed, such as a DSP (DSP=Digital Signal Processor), an ASIC (ASIC=Application-Specific Integrated Circuit), an FPGA (FPGA=Field-Programmable Gate Array) or any other processor.

The object is even further achieved by a network node, which contains the transmitter apparatus. The network node may be for example a base station or a mobile station.

The embodiments provide a first advantage of improving in situations of varying low load or of varying channel conditions which do not always allow an efficient massive MIMO operation, an overall energy efficiency of a radio cell, which is served by a massive MIMO antenna array. The embodiments provide a second advantage of keeping a same general radio coverage by the different operation modes as with a traditional base station equipment. In addition, the embodiments allow for mobile station attachment procedures and for further common signaling procedures in parallel to the massive MIMO operation for guaranteeing permanent and stable radio cell coverage and allow for a stable and reliable cell behavior from the perspective of neighboring radio cells of a massive MIMO radio cell. This means, the massive MIMO radio cell can be involved in handover procedures and/or load balancing procedures in a permanent way even if the number of antenna elements changes during operation of the massive MIMO radio cell. Furthermore, the embodiments provide a further advantage of avoiding separate hardware devices for a massive MIMO radio cell and an overlay radio cell for common signaling in a base station.

Further advantageous features of the embodiments of the invention are defined in the dependent claims and are described in the following detailed description.

BRIEF DESCRIPTION OF THE FIGURES

The embodiments of the invention will become apparent in the following detailed description and will be illustrated by accompanying figures given by way of non-limiting illustrations.

DESCRIPTION OF THE EMBODIMENTS

The description and drawings merely illustrate the principles of the invention. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

Figure 1:
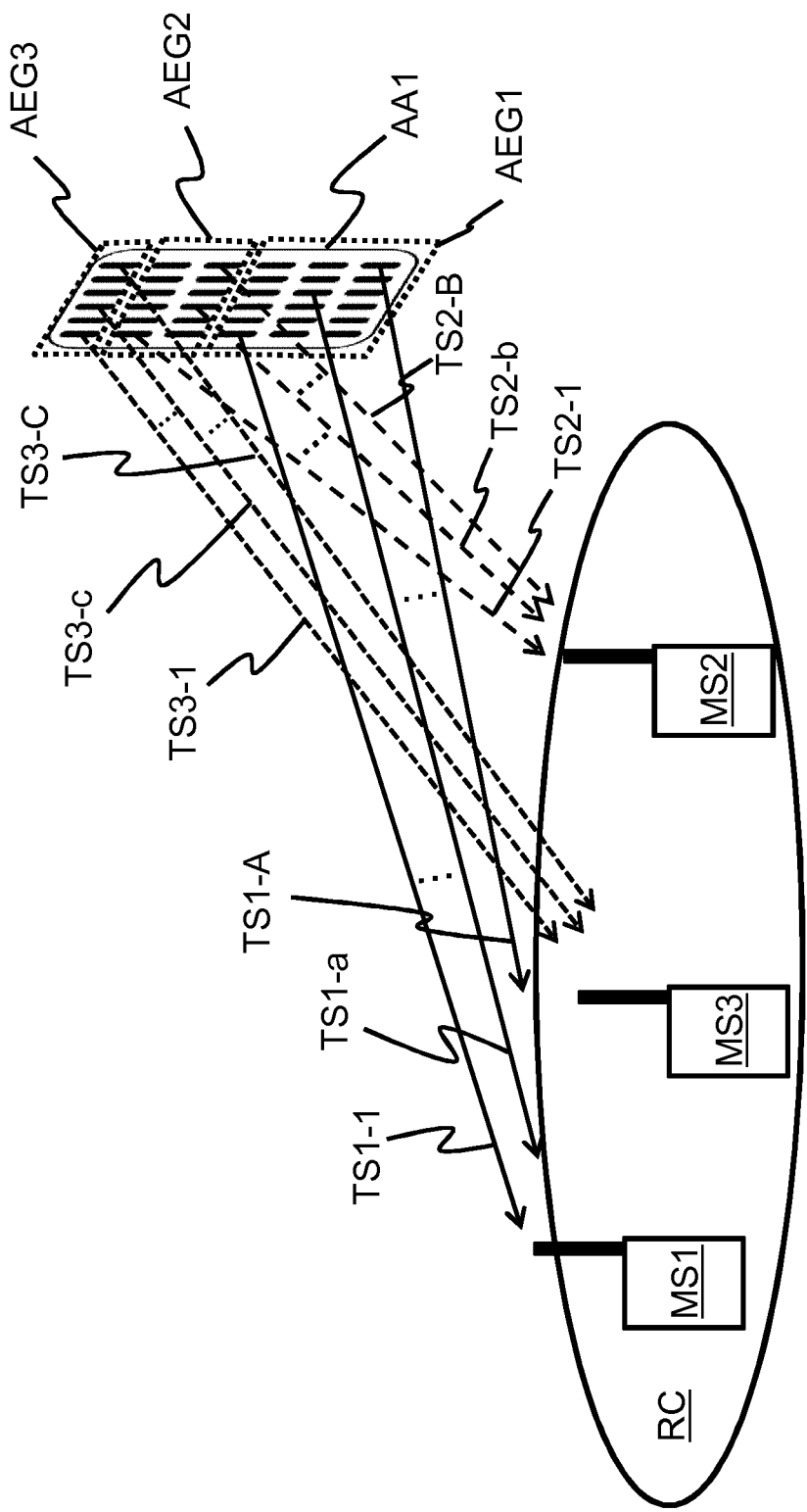
FIG. 1 shows schematically a massive MIMO antenna array, which provides radio coverage for mobile stations in a radio cell according to an exemplary embodiment.

FIG. 1 shows schematically a massive MIMO antenna array AA1, which provides radio coverage for mobile stations MS1, MS2, MS3 in a radio cell RC according to an exemplary embodiment. A base station, which is connected to the massive MIMO antenna array AA1 is not shown for simplification. Also further mobile stations which may be located in the radio cell RC are not shown for simplification.

The term "base station" may be considered synonymous to and/or referred to as a base transceiver station, access point base station, access point, macro base station, macro cell, micro base station, micro cell, etc. and may describe equipment that provides wireless connectivity via one or more radio links to one or more mobile stations. The base station may be for example an LTE Node B (LTE=Long Term Advance), an IEEE 802.11 WLAN access point (IEEE=Institute of Electrical and Electronics Engineers, WLAN=Wireless Local Area Network), a WiMAX base station (WiMAX=Worldwide Interoperability for Microwave Access) etc.

The term "macro base station" may be considered synonymous to and/or referred to a base station, which provides a radio cell having a size in a range of several hundred meters up to several kilometres. A macro base station usually has a maximum output power of typically tens of watts.

The term "micro base station" may be considered synonymous to and/or referred to a base station, which provides a radio cell having a size in a range of several tens of meters up to hundred meters. A micro base station usually has a maximum output power of typically several watts.

The term "macro cell" may be considered synonymous to and/or referred to a radio cell, which provides the widest range of all radio cell sizes. Macro cells are usually found in rural areas or along highways.

The term "micro cell" may be considered synonymous to and/or referred to a radio cell in a cellular network served by a low power cellular base station, covering a limited area (smaller than the area of a macro cell) such as a mall, a hotel, or a transportation hub. A microcell is referred to a group of radio cells, which contain pico cells and femto cells.

The term "pico cell" may be considered synonymous to and/or referred to a small cellular base station typically covering a small area, such as in-building (offices, shopping malls, train stations, stock exchanges, etc.), or more recently in-aircraft. In cellular networks, pico cells are typically used to extend coverage to indoor areas where outdoor signals do not reach well, or to add network capacity in areas with very dense phone usage, such as train stations.

The term "femto cell" may be considered synonymous to and/or referred to a small, low-power cellular base station, typically designed for use in a home or small business. A broader term which is more widespread in the industry is small cell, with femto cell as a subset.

The term "mobile station" may be considered synonymous to, and may hereafter be occasionally referred to, as a mobile unit, mobile user, access terminal, user equipment, subscriber, user, remote station etc. Each of the mobile stations MS1, MS2, MS3 may be for example a cellular telephone, a smartphone, a portable computer, a pocket computer, a hand-held computer, a personal digital assistant, a smart watch, a head mounted display such as a smart glass (e.g. a Google glass) or a car-mounted mobile device.

The term "radio cell" may be considered synonymous to and/or referred to as radio cell, cell, radio sector, sector etc.

The massive MIMO antenna array AA1 shown in FIG. 1 contains 36 antenna elements in a 6×6 arrangement. Alternatively, the massive MIMO antenna array AA1 may contain for example 25 antenna elements in a 5×5 arrangement, 40 antenna elements in a 8×5 arrangement (8 columns and 5 rows), 50 antenna elements in a 5×10 arrangement (5 columns and 10 rows) or 64 antenna elements in a 8×8 arrangement. Certainly, massive MIMO antenna arrays with further number of antenna elements in further arrangements of columns and rows may be used for the present invention.

According to a further embodiment a so-called user centric network with two or more operation modes according to the described embodiments may be applied. Thereby, the massive MIMO antenna array may be represented by antenna systems of a group of distributed base stations such as small cells. This means, that antenna elements of the antenna systems of the group of distributed base stations add up either to at least one first number of antenna elements or antenna elements of a single antenna system of the group of distributed base stations add up to at least one second number of antenna elements smaller than the at least one first number of antenna elements. This means further, that the group of distributed base stations either cooperate in at least one first operation mode for obtaining the massive MIMO antenna array and for transmitting first transmit signals with at least one first transmit power according to the applied at least one first number of antenna elements or each one of the group of distributed base stations may only operate in at least one second operation mode and serve its own antenna system with a smaller number of antenna elements with respect to the massive MIMO antenna array for transmitting second transmit signals according to the applied at least one second number of antenna elements with at least one second transmit power larger than the first transmit power.

The lowest three rows of antenna elements of the massive MIMO antenna array AA1 are allocated in this example to a first group AEG1 of antenna elements, further two rows of antenna elements directly above the lowest three rows of the massive MIMO antenna array AA1 are allocated to a second group AEG2 of antenna elements and topmost row of antenna elements of the massive MIMO antenna array AA1 is allocated to a third group AEG3 of antenna elements. Thereby, the 36 antenna elements of the massive MIMO antenna array AA1 are split into three non-overlapping groups AEG1, AEG2, AEG3 of antenna elements. Alternatively, the groups of antenna elements may be allocated to different columns of antenna elements of the massive MIMO antenna array AA1 or the groups of antenna elements may be arbitrarily chosen by allocating preferably adjacent antenna elements of the massive MIMO antenna array AA1 to the groups of antenna elements.

Alternatively, the 36 antenna elements of the massive MIMO antenna array AA1 may be split only into two non-overlapping groups of antenna elements or may be split into two overlapping groups of antenna elements; e.g. a first group of antenna elements may be provided by all 36 antenna elements and a second group of antenna elements may be provided by two topmost rows of antenna elements of the massive MIMO antenna array AA1. Overlapping groups of antenna elements may be applied preferably, when at least one antenna array is operated in a first operation mode by transmitting first transmit signals from a first number of antenna elements in a first frequency range with a first transmit power and when simultaneously the at least one antenna array is operated in at least one second operation mode by transmitting at least second transmit signals from a second number of antenna elements smaller than the first number of antenna elements in at least one second frequency range different to the first frequency range with a second transmit power larger than the first transmit power (see also description with respect to FIGS. 9 to 11).

Depending on an overall number of antenna elements of a massive MIMO antenna array, the antenna elements may be also split in more than three groups of antenna elements for operating the massive MIMO antenna array and a corresponding transmitter apparatus in more than three operation modes for transmitting more than three different transmit signals with more than three different transmit power levels (see also following description).

In principle, a selection of the groups of antenna elements will be done in such a way, that a predefined gain or predefined beam pattern is obtained. Corresponding groups of antenna elements can be determined for example by antenna simulation algorithms, which are known to skilled persons in the art.

The first group AEG1 of antenna elements is applied for serving a first mobile station MS1 and for transmitting first transmit signals TS1-1, . . . , TS1-$a$, . . . , TS1-A (A is equal to 18 according to the exemplary embodiment; not all first transmit signals TS1-1, . . . , TS1-$a$, . . . , TS1-A are shown in FIG. 1 for simplification) from the antenna elements of the first group AEG1 to the first mobile station MS1. This means that a first one TS1-1 of the first transmit signals TS1-1, . . . , TS1-$a$, . . . , TS1-A is transmitted from a first antenna element of the first group AEG1 and further first transmit signals are transmitted in each case from one of the further antenna elements of the first group AEG1 in a first operation mode with a first transmit power, e.g. the first transmit power may be for example 25 mW.

In a similar way, the second group AEG2 of antenna elements is applied for serving a second mobile station MS2 and for transmitting second transmit signals TS2-1, . . . , TS1-$b$, . . . , TS1-B (B is equal to 12 according to the exemplary embodiment; not all the second transmit signals TS2-1, . . . , TS1-$b$, . . . , TS1-B are shown in FIG. 1 for simplification) from the antenna elements of the second group AEG2 to the second mobile station MS2. This means that a first one TS2-1 of the second transmit signals TS2-1, . . . , TS2-$b$, . . . , TS2-B is transmitted from a first antenna element of the second group AEG2 and further second transmit signals are transmitted in each case from one of the further antenna elements of the second group AEG2 in a second operation mode with a second transmit power larger than the first transmit power, e.g. the second transmit power may be for example 50 mW.

Likewise, the third group AEG3 of antenna elements is applied for serving a third mobile station MS3 and for transmitting third transmit signals TS3-1, . . . , TS3-$c$, . . . , TS3-C (C is equal to 6 according to the exemplary embodiment; not all the third transmit signals TS3-1, . . . , TS3-$c$, . . . , TS3-C are shown in FIG. 1 for simplification) from the antenna elements of the third group AEG3 to the third mobile station MS3. This means that a first one TS3-1 of the third transmit signals TS3-1, . . . , TS3-$c$, . . . , TS3-C is transmitted from a first antenna element of the third group AEG3 and further third transmit signals are transmitted in each case from one of the further antenna elements of the third group AEG3 in a third operation mode with a third transmit power larger than the second transmit power, e.g. the third transmit power may be for example 75 mW.

By serving the mobile stations MS1, MS2, MS3 simultaneously with different number of antenna elements and with different transmit powers, which are adapted in each case to the applied number of antenna elements, a receive power at the mobile stations MS1, MS2, MS3 can be kept within a predefined receive power range.

The reason for serving the mobile stations MS1, MS2, MS3 with different number of antenna elements may be for example different subscription types with a mobile network operator or different types of data traffic currently transmitted to the mobile stations MS1, MS2, MS3. Other parameters, which may be used for selecting a specific operation mode are given in the following description with respect to FIG. 3.

In a further embodiment with respect to FIG. 1 (not shown for simplification), during the day when traffic load is high for the radio cell RC, the mobile stations MS1, MS2, MS3 may be served by first transmit signals from all antenna elements of the antenna array AA1 with a first transmit power (e.g. 10 mW) in a first operation mode and during the night when traffic load is low for the radio cell RC, only a single one or few of the mobile stations MS1, MS2, MS3 may be served by second transmit signals from all antenna elements of one of the groups AEG1, AEG2, AEG3 with a second transmit power (depending on the chosen group of antenna elements) larger than the further first transmit power in a second operation mode. Thereby, power amplifiers (see for example FIG. 5) which are connected to non-used antenna elements may be switched off.

During the night or even at some points in time during the day, no one of the mobile stations MS1, MS2, MS3 may be in a CONNECTED mode and therefore the massive MIMO antenna array AA1 and the corresponding connected transmitter apparatus may be in an IDLE mode using for example only 6 antenna elements. In the IDLE mode for example about 5% of a maximum power consumption of the radio cell RC has still to be transmitted for maintaining within the coverage area of the radio cell RC control channels and signalling channels such as BCH (BCH=Broadcast Channel), PDCCH (PDCCH=Physical Downlink Control Channel) and/or PCFICH (PCFICH=Physical Control Format Indicator Channel) as applied in LTE. In such a case, a transmit power of the transmit signals to be transmitted for the remaining 6 antenna elements may be increased up to 6 times a transmit power of a single antenna element used during an operation of all antenna elements of the massive MIMO antenna array AA1.

In an even further alternative embodiment (also not shown in FIG. 1 for simplification), one or several of the mobile stations MS1, MS2, MS3 may also contain a mobile station based massive MIMO antenna array and may transmit first uplink transmit signals by a first number of antenna elements of the mobile station based massive MIMO antenna array to the base station based massive MIMO antenna array AA1 in a first operation mode with a first uplink transmit power or may transmit second uplink transmit signals by a second number of antenna elements of the mobile station based massive MIMO antenna array smaller than the first number of antenna elements of the mobile station based massive MIMO antenna array to the base station based massive MIMO antenna array AA1 in a second operation mode with a second uplink transmit power larger than the first uplink transmit power.

The first uplink transmit power and the second uplink transmit power may be determined for example according to following approximation (a more precise determination may be obtained by corresponding simulations known to skilled persons in the art): An antenna gain of the mobile stations MS1, MS2, MS3 with respect to a conventional antenna may be for example equal to 9 dB and a transmission power Ptx of the mobile stations MS1, MS2, MS3 may be for example equal to 24 dBm. If the antenna gain changes, the transmission power of the mobile stations MS1, MS2, MS3 may be adapted according to following assumption: If the number of used antenna elements is doubled an antenna gain of 3 dB may be obtained resulting in following equation:

$$g_{MM} = 3 \cdot \log_2(N_{antennas}) \qquad (1)$$

wherein $g_{MM}$: MIMO antenna gain, $N_{antennas}$: number of applied antenna elements.

If for example 64 antenna elements are applied, a MIMO antenna gain of 18 dB can be obtained, which is 9 dB more than with a conventional antenna. Thereby, an upper bound (in case of optimum gain) for a minimum transmission power Ptx' can be obtained by following equation:

$$Ptx' = Ptx - 9 \text{ dBm} = 15 \text{ dBm} = 32 \text{ mW} \qquad (2)$$

In a further alternative embodiment, the mobile stations MS1, MS2, MS3 may be capable to exchange data directly by transmitting for example radio frequency signals from the first mobile station MS1 directly to the third mobile station MS3, which is located next to the first mobile station MS1. Thereby, the first mobile station MS1 may apply a first operation mode with a first short-range transmit power (e.g. 10 μW) by transmitting first short-range transmit signals from a first number of antenna elements of the mobile station based massive MIMO antenna array to the third mobile station MS3 or may apply a second operation mode with a second short-range transmit power (e.g. 25 μW) being larger than the first short-range transmit power by transmitting second short-range transmit signals to the third mobile station MS3 from a second number of antenna elements of the mobile station based massive MIMO antenna array being smaller than the first number of antenna elements of the mobile station based massive MIMO antenna array.

Figure 2:
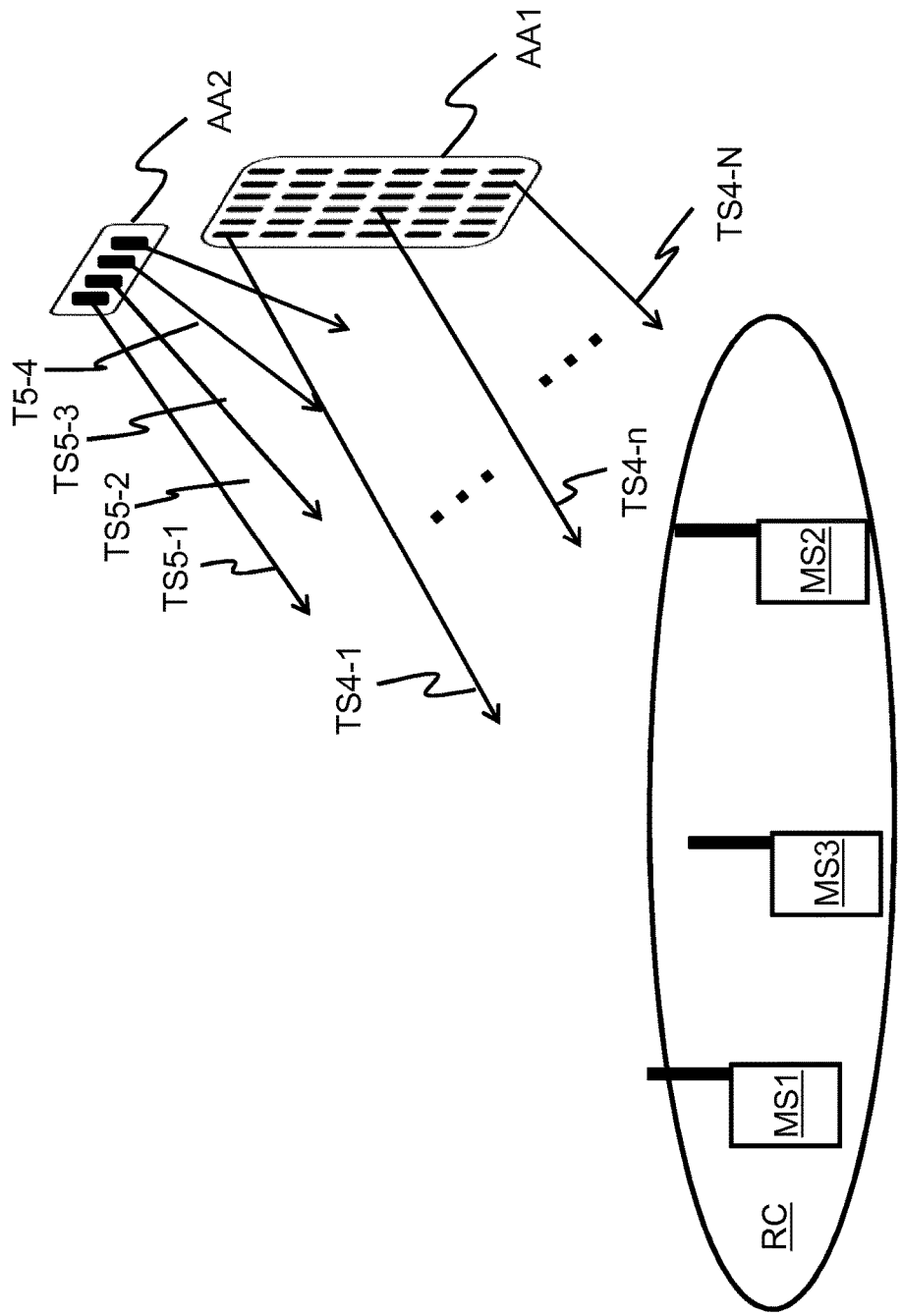
FIG. 2 shows schematically a massive MIMO antenna array, which provides radio coverage for high load in a radio cell, and a further antenna array, which provides radio coverage for signaling and basic load in the radio cell according to a further exemplary embodiment.

FIG. 2 shows schematically the massive MIMO antenna array AA1 and a further antenna array AA2 with a considerably lower number of antenna elements (e.g. 4 antenna elements compared to 36 antenna elements as shown in FIG. 2). The massive MIMO antenna array AA1 may be located at a first height with respect to the Earth's surface and the further antenna array AA2 may be located preferably at a second height with respect to the Earth's surface and the second height may be larger than the first height (e.g. the further antenna array AA2 may be located on top of the massive MIMO antenna array AA1). In further alternatives, the further antenna array AA2 may be located next to the massive MIMO antenna array AA1 on the left side or the right side adjacent to the massive MIMO antenna array AA1 for example on a same average height of both antenna arrays AA1, AA2 with respect to the Earth's surface.

During the day when traffic load is high for the radio cell RC, the mobile stations MS1, MS2, MS3 may be served by first transmit signals TS4-1, . . . , TS4-n, . . . , TS4-N (not all the first transmit signals TS4-1, . . . , TS4-n, . . . , TS4-N are shown in FIG. 2 for simplification) from all antenna elements of the antenna array AA1 with a first transmit power (e.g. 10 mW) in a first operation mode and during the night when traffic load is low for the radio cell RC only a single one or few of the mobile stations MS1, MS2, MS3 may be served by second transmit signals TS5-1, TS5-2, TS5-3, TS5-4 each transmitted from one of the antenna elements of the further antenna array AA2 with a second transmit power (e.g. 80 mW) larger than the first transmit power in a second operation mode. Further parameters which may be evaluated alternatively or in addition for selecting one of the operation modes are described in the following with respect to the FIG. 3.

In a further embodiment with respect to FIG. 2 (not shown for simplification), for example two of the mobile station MS1, MS2, MS3 may be served by the first transmit signals TS4-1, ..., TS4-n, ..., TS4-N and a single one of the mobile stations MS1, MS2, MS3 may be served simultaneously by the second transmit signals TS5-1, TS5-2, TS5-3, TS5-4.

Figure 3:
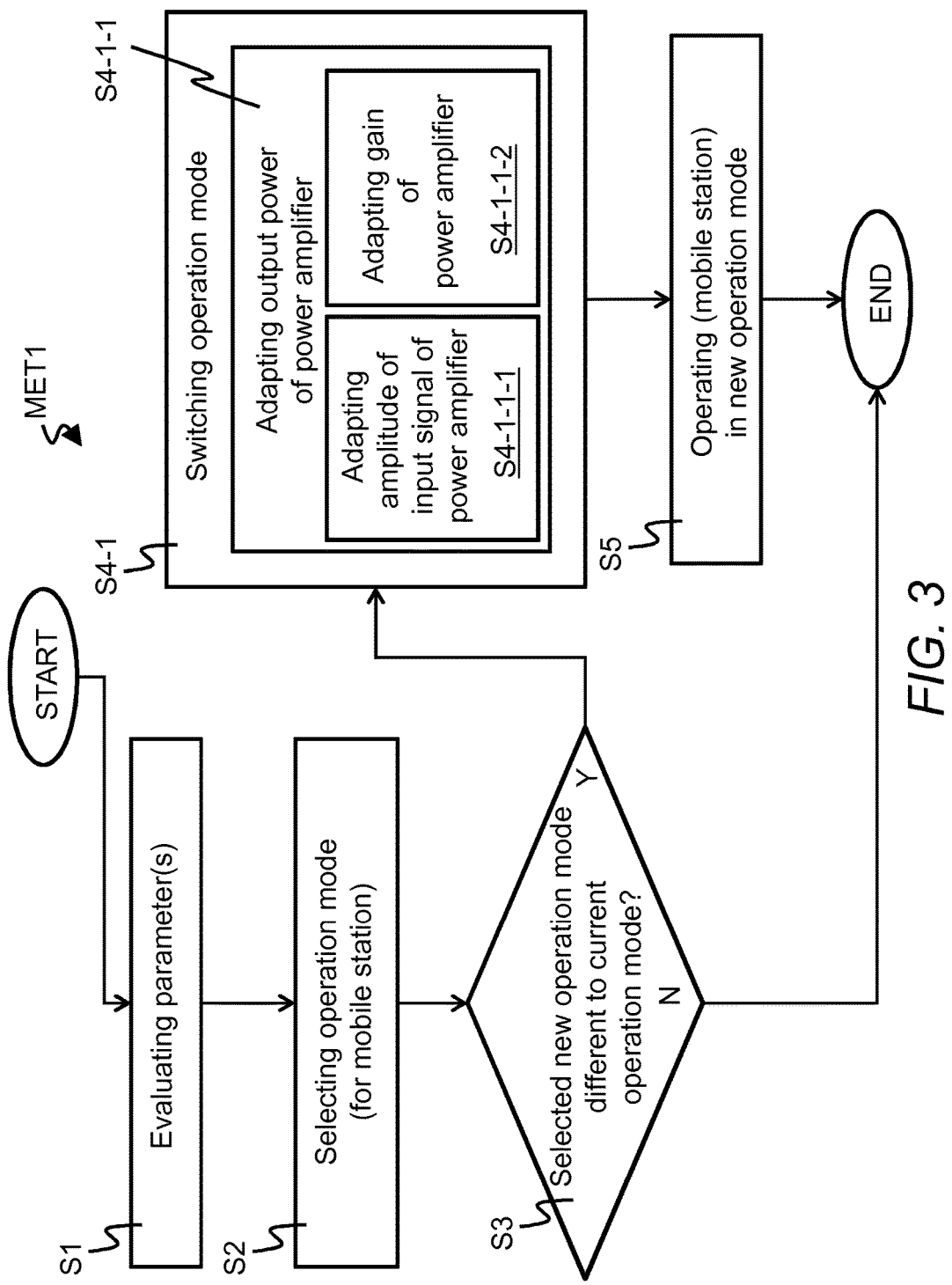
FIG. 3 shows schematically a flow diagram of a transmitter method for operating a transmitter apparatus in a first MIMO operation mode and/or in at least one second MIMO operation mode according to a first exemplary embodiment.

FIG. 3 shows a flow diagram of a first transmitter method MET1 for operating a transmitter apparatus TRA (see FIG. 4) in a first MIMO operation mode and in at least one second MIMO operation mode according to a first exemplary embodiment. The number of the steps for performing the first method MET1 is not critical, and as can be understood by those skilled in the art that the number of the steps and the sequence of the steps may vary without departing from the scope of the embodiments of the invention as defined in the appended claims.

The first method MET1 may be started for example when a network node NN, which contains the transmitter apparatus TRA (see FIG. 4), is switched on or periodically, when a time period of a timer has expired or by a trigger, when transmission conditions within a radio cell such as data load, transmission characteristics of transmission channels, operating parameters such as device types of connected mobile stations or stationary stations etc. or operating parameters of the network node NN itself such as battery state have reached a predefined threshold. The network node NN may be for example a base station or a mobile station.

In a first step S1, when for example the second mobile station MS2 (see FIG. 1) has been switched on within the radio cell RC or has been transferred to the radio cell RC by a handover, a central control unit CCU as part of the transmitter apparatus TRA-APP (see FIG. 4) may evaluate one or several transmission conditions for the radio transmissions from the massive MIMO antenna array AA1 to the mobile stations MS1, MS2, MS3, one or several operating parameters of the base station which is connected to the massive MIMO antenna array AA1, or one or several operating parameters of the mobile stations MS1, MS2, MS3, further operating parameters for the radio transmissions, or further transmission conditions. Equal or similar parameters may be used for an evaluation with respect to the other alternative embodiments, which are sketched and described (see FIG. 2) or only described in the above description.

The transmission conditions for the radio transmissions from the massive MIMO antenna array AA1 to the mobile stations MS1, MS2, MS3 may be for example:
path loss;
received signal strength.

If for example a channel characteristic may for example not provide a predefined gain (e.g. a predefined channel rank for spatial multiplexing) by a current operation mode, a further currently not used operation mode may provide a gain equal to or above the predefined gain.

The operating parameters of the base station may be for example:
pending data load or buffer states for downlink transmission to the mobile stations MS1, MS2, MS3;
charge state of rechargeable battery, when the base station is for example powered by a solar panel or a wind engine;
level of fuel, when the base station is for example powered by a diesel generator.

The operating parameters of the mobile stations MS1, MS2, MS3 may be for example:
subscription types such as a normal user or a so-called Gold user, who is willing to pay more for her/his subscription for getting a larger data rate or a larger monthly flat rate for example by being served by the first operation mode in comparison to normal users, who may be basically served by the second operation or the third operation mode with respect to the embodiment shown in FIG. 1;
current consumption of monthly data volume of the mobile stations MS1, MS2, MS3, e.g. when the monthly flat rate is exceeded, the user may be switched from the first operation mode to the second operation mode or the third operation mode;
activity states such as a so-called IDLE state or a so-called CONNECTED state, e.g. mobile stations in CONNECTED state may be served by the first operation mode and further mobile stations in IDLE state may be served for signaling purposes by the second or third operation mode;
device types of the mobile stations MS1, MS2, MS3 such as so-called smartphone, a notebook, a sensor, a device for a machine-to-machine communication, a so-called feature phone which is priced at a mid-range in a wireless provider's hardware lineup, a car-mounted mobile device etc.

The further operating parameters may be for example:
current traffic types of data such as Video, Webbrowsing, VoIP (VoIP=Voice over IP, IP=Internet Protocol) etc. being transmitted to the mobile stations MS1, MS2, MS3;
current pre-defined rules for operating the base station, e.g. legislator rules concerning spectrum masks or agreements between different mobile network operators or rules which govern an interaction between different base stations of a same mobile network operator.

The further transmission conditions may be for example:
current time of day such as morning hours, lunchtime, afternoon, daytime, evening hours, night;
geographical environment such as rural or urban.

When only a single operating parameter or transmission condition is evaluated by the step S1, range of values of the operating parameters or transmission conditions may be simply allocated to corresponding operation modes for providing for example on the one hand an energy efficient transmission and on the other hand preferably a high data throughput.

When two or more operating parameters and/or transmission conditions will be evaluated the operating parameters and transmission conditions may be given different priorities. When for example a first operating parameter or a first transmission condition has a first priority and indicates the first operation mode due to a current value of the first parameter or the first condition and a second operating parameter or a second transmission condition has a second priority larger than the first priority and indicates the second operation mode due to a current value of the second parameter or the second condition, the second operation mode may be a result of the evaluation.

Alternatively when two or more operating parameters and/or transmission conditions will be evaluated, different numbers of points may be allocated to different ranges of values of the operating parameters and transmission conditions and points of operating parameters and/or transmission conditions may be add to an overall score. A table may provide a mapping between different ranges of the overall score and for example a first, a second and a third operation mode. From this mapping an operation mode may be provided as a result of the evaluation.

In a next step S2, the central control unit CCU may select one of the first, second or third operation modes for the second mobile station MS2. With respect to the embodiment shown in FIG. 1 the second operation mode may be selected as a new operation mode for the second mobile station MS2.

In a further step S3, the central control unit CCU may verify whether the new operation mode is different to a currently used operation mode for the second mobile station MS2. When for example a further mobile station is already served by the second group AEG2 of antenna elements, the new operation mode for the second mobile station MS2 is equal to a currently applied operation mode. In such a case, a transmission of data to the second mobile station MS2 may be overlaid to a further transmission of further data to the further mobile station via the second group AEG2 of antenna elements and no further steps with respect to the first method MET1 may be required.

When else no mobile station is currently served by the second group AEG2 of antenna elements, the second operation mode may be not applied currently and the second group AEG2 of antenna elements may currently not transmit and/or not receive any radio frequency signals because transmitter apparatuses and/or receiver apparatuses, which are connected to the second group AEG2 of antenna elements are in an IDLE state with low power consumption or switched off.

Figure 4:
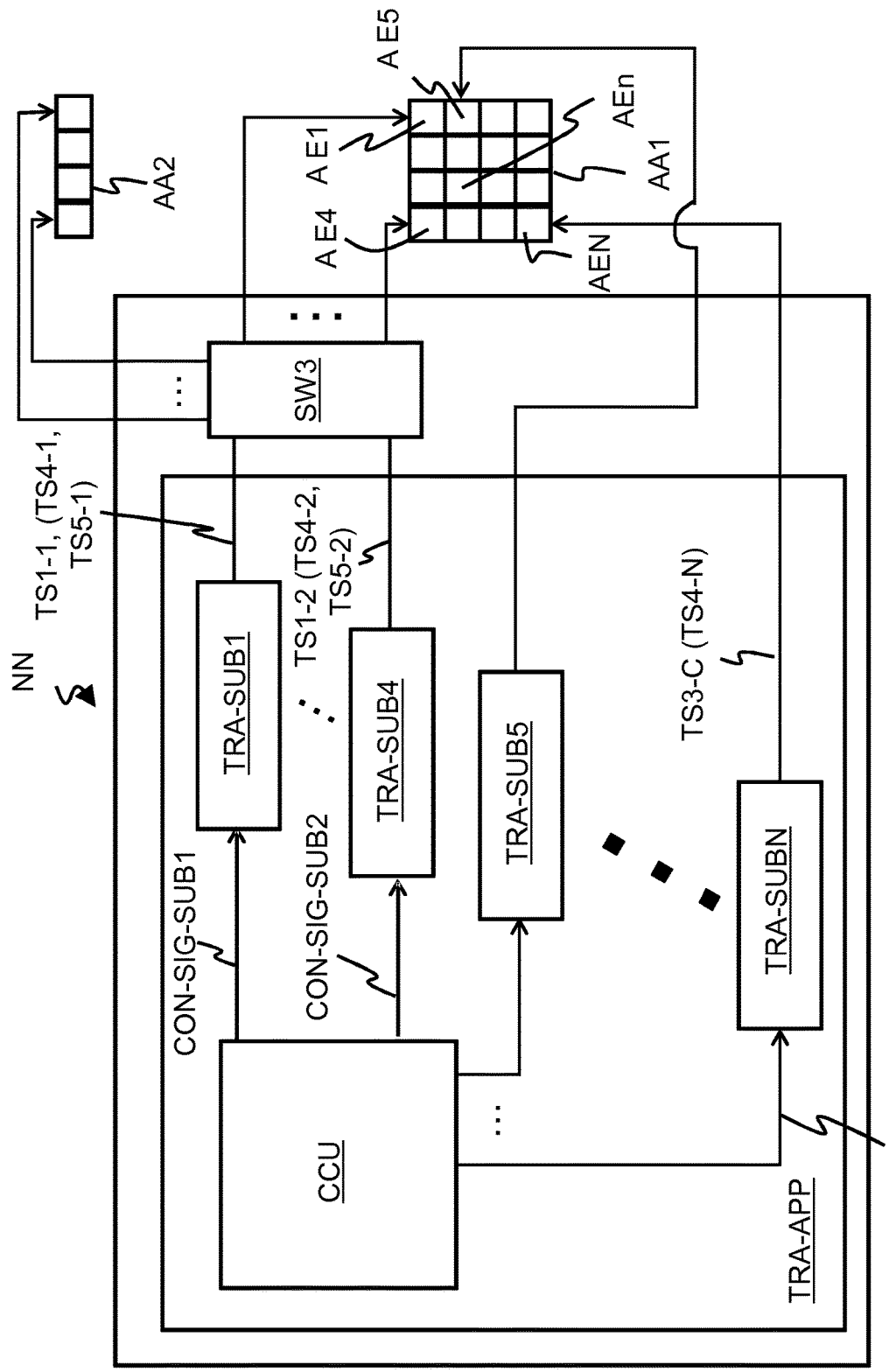
FIG. 4 shows schematically a block diagram of an antenna array and of a network node, which contains a transmitter apparatus with several transmitter subunits according to an exemplarily embodiment.

Therefore in a next step S4-1, the central control unit CCU may switch on the second operation mode for example in a following way:

As sketched in FIG. 4, each of antenna elements AE1, ..., AEn, ..., AEN of a massive MIMO antenna system AA may be connected to a dedicated and separate transmitter subunit TRA-SUB1, ..., TRA-SUB4, TRA-SUB5, ..., TRA-SUBN. Alternatively, groups of two, four or more adjacent antenna elements may be connected and passively coupled to a single transmitter subunit for reducing hardware complexity.

The massive MIMO antenna system AA may be for example the massive MIMO system AA1 as shown in FIG. 1 or the group of two antenna systems AA1, AA2 as shown in FIG. 2 (e.g. upper row of antenna elements of the massive MIMO antenna system AA represent the antenna array AA2 and lower rows of antenna elements of the massive MIMO antenna system AA represent the massive MIMO antenna system AA1).

Depending on an application of one or several operation modes, first transmit signal TS1-1 may be transmitted from a first transmitter subunit TRA-SUB1 to a first antenna element AE1, first transmit signal TS1-2 may be transmitted from a second transmitter subunit TRA-SUB2 to a second antenna element AE2, and so on, and third transmit signal TS3-C may be transmitted from an N-th transmitter subunit TRA-SUBN to an N-th antenna element AEN (with respect to FIG. 1).

Optionally, when with respect to FIG. 2 only one of the antenna arrays AA1, AA2 will always be operated, hardware devices may be reduced by connecting in each case one of the four antenna elements of the antenna array AA2 and one of four antenna elements of the massive MIMO antenna array AA1 to a same transmitter subunit TRA-SUB1, ..., TRA-SUB4 and the network node NN may contain a switch SW3 (see FIG. 4) to either switch transmit signals coming from the output of the transmitter subunits TRA-SUB1, ..., TRA-SUB4 to either antenna elements of the antenna array AA2 or to antenna elements AE1, ..., AE4 of the massive MIMO antenna array AA1.

Each of the transmitter subunits TRA-SUB1, TRA-SUB2, ..., TRA-SUBN may be connected by corresponding signaling lines to the central control unit CCU. This allows the central control unit CCU to transmit a first control signal CON-SIG-SUB1 to the first transmitter subunit TRA-SUB1 for setting the first transmitter subunit TRA-SUB1 into one of the operation modes. Similarly, the central control unit CCU may transmit a second control signal CON-SIG-SUB2 to the second transmitter subunit TRA-SUB2 for setting the second transmitter subunit TRA-SUB2 into one of the operation modes, and so on and the central control unit CCU may transmit an N-th control signal CON-SIG-SUBN to the N-th transmitter subunit TRA-SUBN for setting the N-th transmitter subunit TRA-SUBN into one of the operation modes.

The transmitter apparatus TRA may be alternatively not part of the network node NN (as shown in FIG. 4) but instead remotely connected as an RRH (RRH=remote radio head) to the network node NN.

Figure 5:
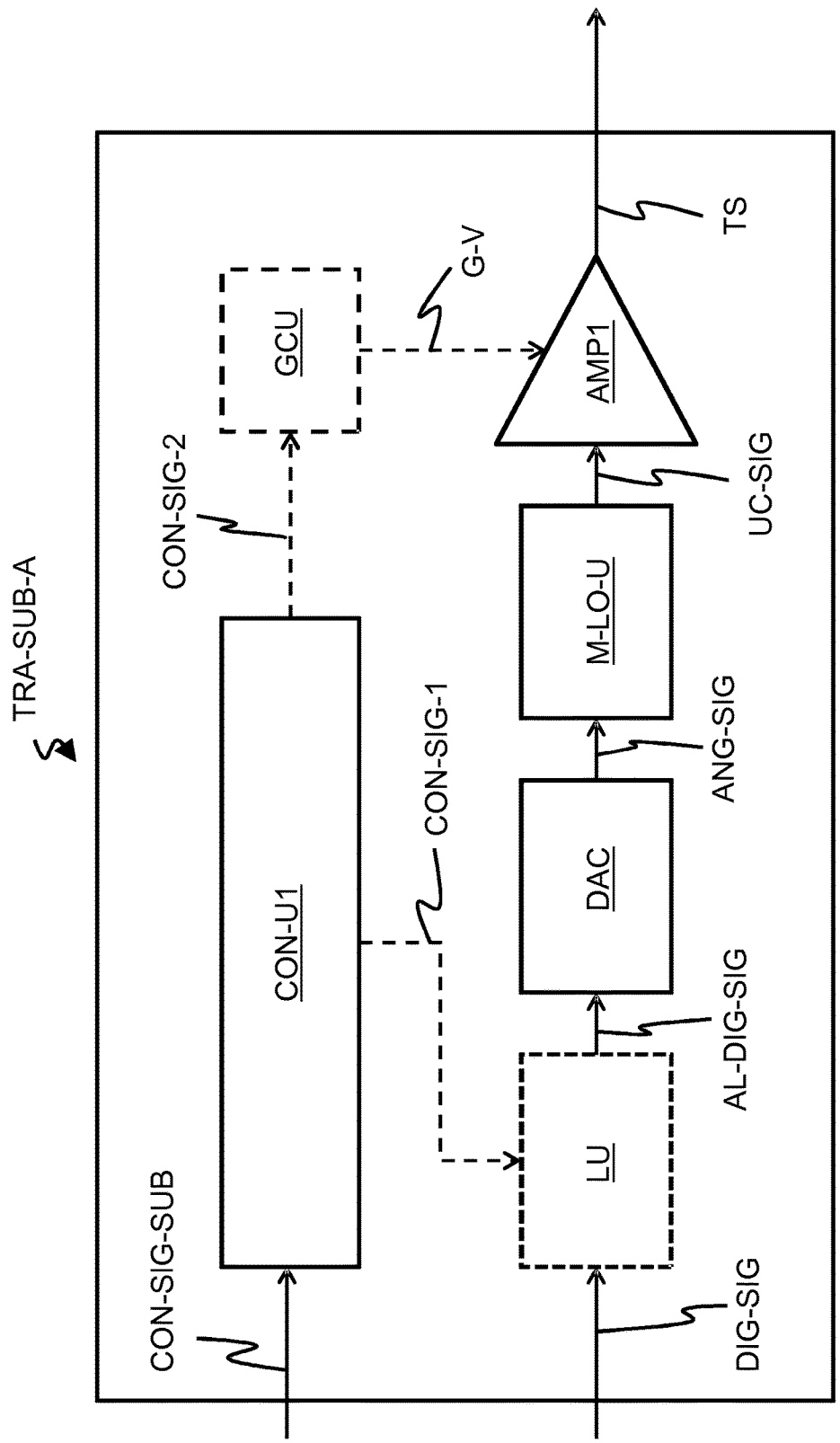
FIG. 5 shows schematically a block diagram of a transmitter subunit for providing first transmit signals in the first MIMO operation mode or at least second transmit signals in the at least second MIMO operation mode according to a first exemplary embodiment.

According to one alternative embodiment, the switching step S4-1 may contain a sub-step S4-1-1 (see FIG. 3) for adapting an output power of several of the transmitter subunits TRA-SUB1, TRA-SUB2, ..., TRA-SUBN, which are connected to the group AEG2 (see FIG. 1) by adapting output powers of corresponding power amplifiers. An exemplarily embodiment of such a transmitter subunit TRA-SUB-A is shown in FIG. 5.

The transmitter subunit TRA-SUB-A contains a control unit CON-U1, which is adapted to receive a control signal CON-SIG-SUB from the central control unit CCU. The transmitter subunit TRA-SUB-A further contains an optional leveling unit LU, which is adapted to receive a digital signal DIG-SIG. The digital signal DIG-SIG may contain for example a real part and an imaginary part of a data signal. The leveling unit LU may be for example a digital module, which multiplies the real part and the imaginary part by a gain value. Thereby in a sub-step S4-1-1-1, an amplitude of an input signal of a power amplifier AMP1 can be adapted to obtain a predefined or required transmit power of the transmit signal TS according to an instruction by a control signal CON-SIG-1. A dynamic range of the transmit power of the transmit signal TS may be between a first level and a second level, which is X-times the first level; e.g. between 10 mW and 80 mW with X equal to 8.

The control signal CON-SIG-1 may be sent from the control unit CON-U1 to the leveling unit LU, when the control unit CON-U1 has received the control signal CON-SIG-SUB from the central control unit CCU for either reducing or increasing a transmit power of a transmit signal TS being generated by the transmitter subunit TRA-SUB-A. In an alternative embodiment, the transmitter subunit TRA-SUB-A may not contain the control unit CON-U1 and the control signal CON-SIG-SUB may be directly provided to the leveling unit LU. The leveling unit LU generates an amplitude leveled digital signal AL-DIG-SIG.

The transmitter subunit TRA-SUB1 further contains a digital-to-analogue converter DAC, which receives the amplitude leveled digital signal AL-DIG-SIG and which converts digital values of the amplitude leveled digital signal AL-DIG-SIG into an analogue signal ANG-SIG.

The transmitter subunit TRA-SUB1 further contains a modulator and local oscillator unit M-LO-U, which up-converts the analogue signal ANG-SIG into an up-converted signal UC-SIG with a frequency range, which may be for example in the MHz or GHz range.

The transmitter subunit TRA-SUB1 further contains a power amplifier AMP1, which amplifies the up-converted signal UC-SIG to a transmit power, which corresponds to an operation mode of the transmit signal TS.

When the power amplifier AMP1 is operated by a constant gain, the transmit power of the transmit signal TS will be adapted by leveling amplitude values of the digital signal DIG-SIG using the leveling unit LU.

According to an alternative embodiment, the transmitter subunit TRA-SUB-A may contain instead of the leveling unit LU a gain control unit GCU. The gain control unit GCU may be adapted to receive a control signal CON-SIG-2 from the control unit CON-U1. The control signal CON-SIG-2 may contain either an instruction to increase a gain of the power amplifier AMP1 or to reduce the gain of the power amplifier AMP1 by a further sub-step S4-1-1-2. Depending on the instruction, the gain control unit GCU adjusts a gain value G-V at the power amplifier AMP1 for example by digitally controlling a bias current of the power amplifier AMP1. In a further alternative, the control signal CON-SIG-SUB may be directly provided from the central control unit CCU to the gain control unit GCU and thereby, the control unit CON-U1 does not need to be part of the transmitter subunit TRA-SUB-A.

In one further alternative embodiment, the control signal CON-SIG-1 and the control signal CON-SIG-2 may be simultaneously provided to the leveling unit LU and the gain control unit GCU for adjusting the leveling unit LU and the gain of the power amplifier AMP1 and for adapting the transmit power of the transmit signal TS in accordance to one of the operation modes.

In a further step S5 of the first transmitter method MET1, the transmitter apparatus TRA of the network node NN is operated with the new operation mode, which is for example the second operation mode for the second mobile station MS2 with respect to the embodiment shown in FIG. 1.

In a further application scenario with respect to the FIG. 2, only the massive MIMO antenna array AM may be operated in the first operation mode during day time for serving the mobile stations MS1, MS2, MS3. May be at a fixed point in time such as 10 pm, the transmitter apparatus TRA may determine by the step S1 that current time has reached the 10 pm instant of time. According to a predefined rule, the transmitter apparatus TRA may select by the step S2 the second operation mode as a new operation mode for the radio cell RC. During the step S3, the transmitter apparatus TRA may assert that the second operation mode is a new operation mode, which is currently not applied. Therefore, during the step S4-1 the transmitter apparatus TRA may switch transmitter subunits, which are connected to the antenna elements of the antenna array AA2, from an IDLE state to an on-state for example by switching on power amplifiers of the corresponding transmitter subunits and may switch further transmitter subunits, which are connected to the antenna elements of the massive MIMO antenna array AA1, from the on-state to the IDLE state by switching off power amplifiers of further corresponding transmitter subunits.

Figure 6:
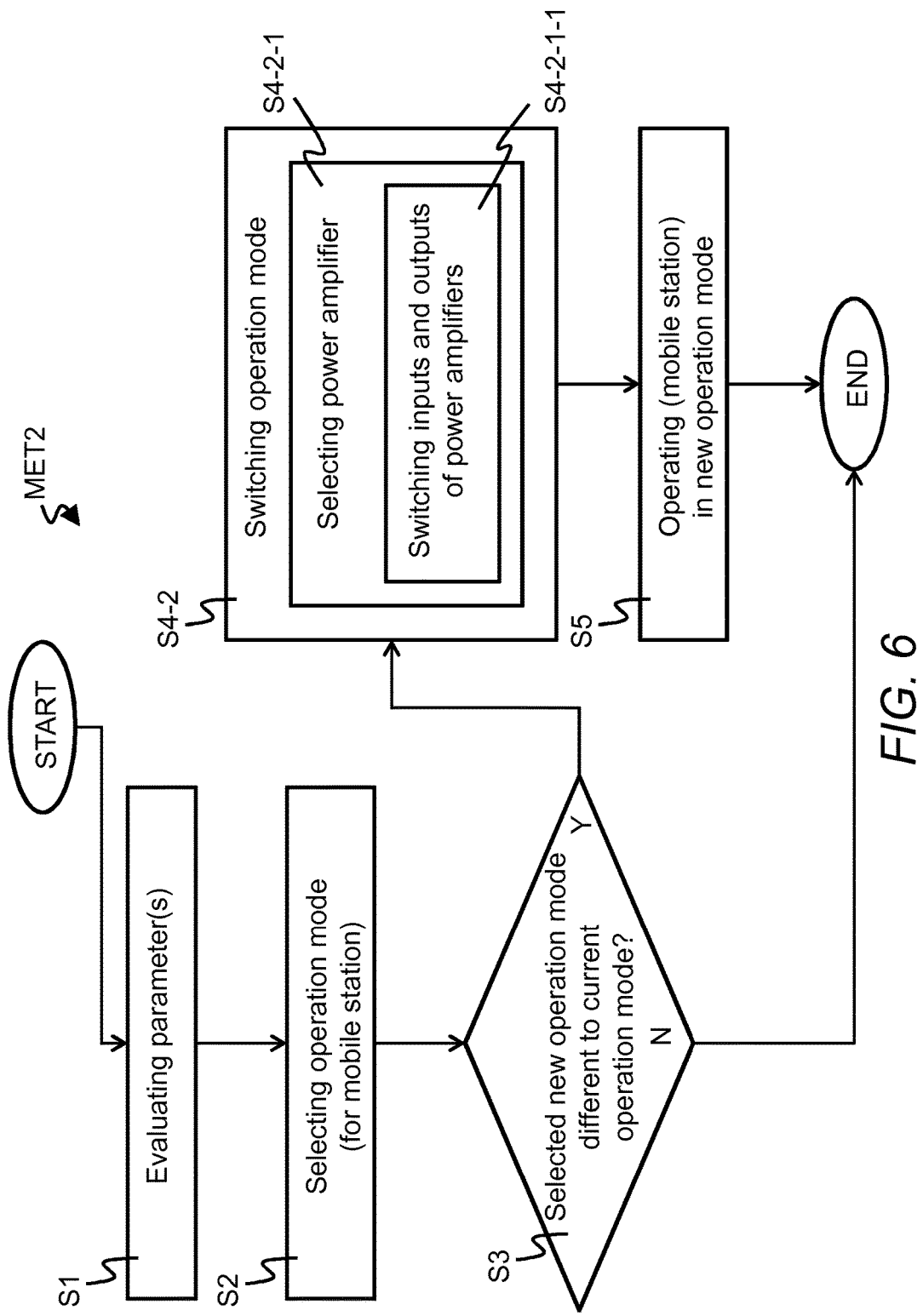
FIG. 6 shows schematically a flow diagram of a transmitter method for operating a transmitter apparatus in a first MIMO operation mode and/or in at least one second MIMO operation mode according to a second exemplary embodiment.

FIG. 6 shows a flow diagram of a second transmitter method MET2 for operating the transmitter apparatus TRA-APP (see FIG. 4) in a first MIMO operation mode and in at least one second MIMO operation mode according to a second exemplary embodiment. The number of the steps for performing the second transmitter method MET2 is not critical, and as can be understood by those skilled in the art that the number of the steps and the sequence of the steps may vary without departing from the scope of the embodiments of the invention as defined in the appended claims. The elements in FIG. 6 that correspond to elements of FIG. 3 have been designated by same reference numerals.

Only the difference of the second transmitter method MET2 with respect to the first transmitter method MET1 will be described in the following. Step S4-1 of the first transmitter method MET1 is replaced according to the second transmitter method MET2 by a step S4-2 for switching the operation mode of the transmitter apparatus TRA-APP. The step S4-2 contains a sub-step S4-2-1 of selecting a power amplifier for providing a transmit power of a transmit signal according to a selected operation mode.

Figure 7:
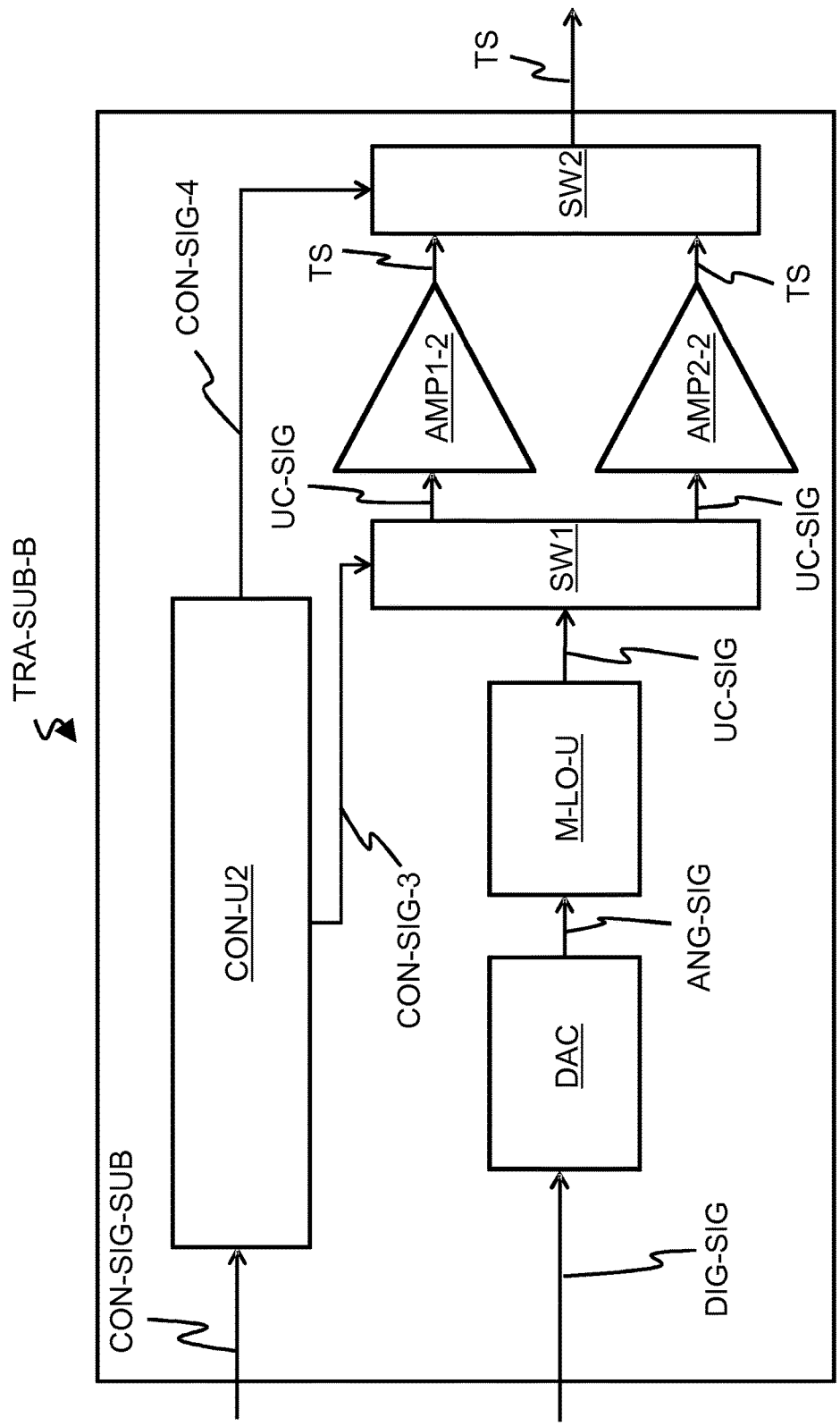
FIG. 7 shows schematically a block diagram of a transmitter subunit for providing first transmit signals in the first MIMO operation mode or at least second transmit signals in the at least second MIMO operation mode according to a second exemplary embodiment.

FIG. 7 shows an exemplarily embodiment, how this switching step S4-2 may be realized by a transmitter subunit TRA-SUB-B. The elements in FIG. 7 that correspond to elements of FIG. 5 have been designated by same reference numerals. The transmitter subunit TRA-SUB-B may correspond to the transmitter subunits TRA-SUB1, TRA-SUB2, . . . , TRA-SUBN of the transmitter apparatus TRA shown in FIG. 4.

The transmitter subunit TRA-SUB-B contains a control unit CON-U2, the digital-to-analogue converter DAC, the modulator and local oscillator unit M-LO-U, two switches SW1, SW2 and two switchable power amplifiers AMP1, AMP2. The transmitter subunit TRA-SUB-B may alternatively contain more than two power amplifiers for more than two operation modes. A first switch SW1 is located between an output of the modulator and local oscillator unit M-LO-U and inputs of the two power amplifiers AMP1, AMP2. A second switch SW2 is located between outputs of the two power amplifiers AMP1, AMP2 and an output of the transmitter subunit TRA-SUB-B for the transmit signal TS. When the control unit CON-U2 receives the control signal CON-SIG-SUB for switching to one of the operation modes, the control unit CON-U2 may select one of the two power amplifiers AMP1, AMP2, which is optimized for an energy efficient generation of a transmit power of the transmit signal TS, which corresponds to the corresponding operation mode. The sub-step S4-2-1 may contain a sub-step S4-2-1-1 of switching the up-converted signal UC-SIG to an input of one of the two power amplifiers AMP1, AMP2, which is optimized for generating the transmit signal TS with the transmit power required for the new selected operation mode and switching the transmit signal TS from the output of the corresponding power amplifier to the output of the transmitter subunit TRA-SUB-B. With respect to FIG. 7, both switching processes can be realized by the switches SW1, SW2. Therefore, the control unit CON-U2 may transmit a control signal CON-SIG-3 to the first switch SW1 and a further control signal CON-SIG-4 to the second switch SW2.

Figure 8:
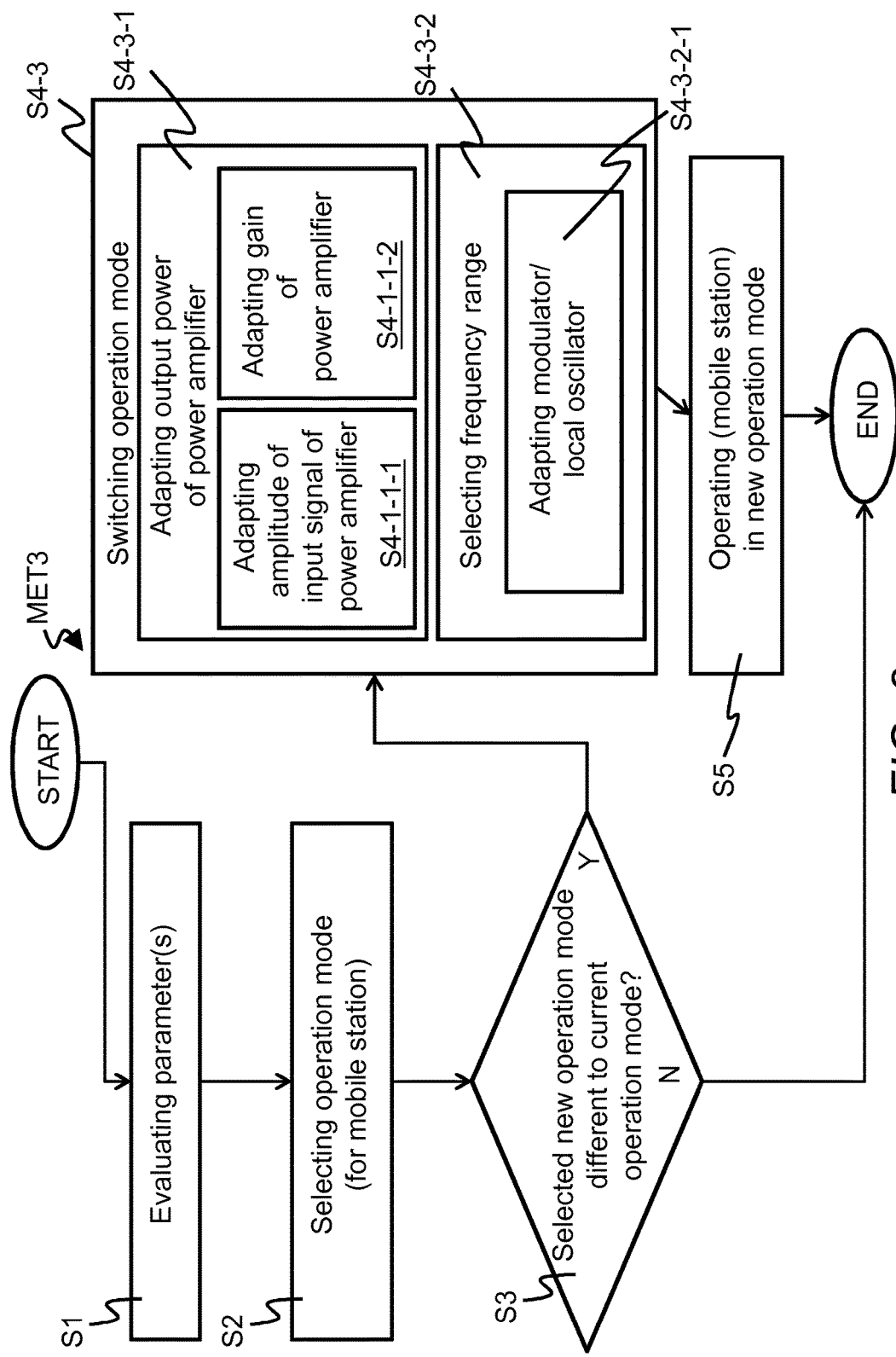
FIG. 8 shows schematically a flow diagram of a transmitter method for operating a transmitter apparatus in a first MIMO operation mode and/or in at least one second MIMO operation mode according to a third exemplary embodiment.

FIG. 8 shows a flow diagram of a third transmitter method MET3 for operating the transmitter apparatus TRA-APP (see FIG. 4) in a first MIMO operation mode and in at least one second MIMO operation mode according to a third exemplary embodiment. The number of the steps for performing the third transmitter method MET3 is not critical, and as can be understood by those skilled in the art that the number of the steps and the sequence of the steps may vary without departing from the scope of the embodiments of the invention as defined in the appended claims. The elements in FIG. 8 that correspond to elements of FIG. 3 have been designated by same reference numerals.

Only the difference of the third transmitter method MET3 with respect to the first transmitter method MET1 will be described in the following. Step S4-1 of the first transmitter method MET1 is replaced according to the third transmitter method MET3 by a step S4-3 for switching the operation mode of the transmitter apparatus TRA-APP. The step S4-3 contains a first sub-step S4-3-1 of adapting an output power of a power amplifier in such a way, that a transmit power of a transmit signal corresponds to a predefined transmit power as required by the new selected operation mode. The first sub-step S4-3-1 may contain the sub-step S4-1-1-1 of adapting an amplitude level of a signal to be amplified by the power amplifier for obtaining the predefined transmit power. The first sub-step S4-3-1 may contain the further sub-step S4-1-1-2 of adapting the gain of at least one power amplifier.

The step S4-3 further contains a second sub-step S4-3-2 of selecting a frequency range for the transmit signal, so that the selected frequency range is equal to a predefined frequency range as required by the new selected operation mode. The second sub-step S4-3-2 may contain a sub-step S4-3-2-1 of adapting a frequency of a local oscillator for modulating and up-converting the transmit signal to the predefined frequency range.

One of the frequency ranges may be applied for basic signalling procedures such as terminal attachment and synchronization and for data rates below a predefined data rate. One or several further frequency ranges may be for example applied for data rates above the predefined data rate to enable a massive MIMO data delivery. A mobile station MS1, MS2, MS3 may attach to the radio cell RC for example in a second operation mode with a transmission of second transmit signals with a second transmit power from a second number of antenna elements and may be hand-off after finishing the attachment to a first operation mode (e.g. a massive MIMO operation mode) with a transmission of first transmit signals with a first transmit power smaller than the second transmit power from a first number of antenna elements larger than the second number of antenna elements. When data delivery to the mobile station MS1, MS2, MS3 is finished or reduced, the mobile station MS1, MS2, MS3 may be hand-off back to the second operation mode.

Figure 9:
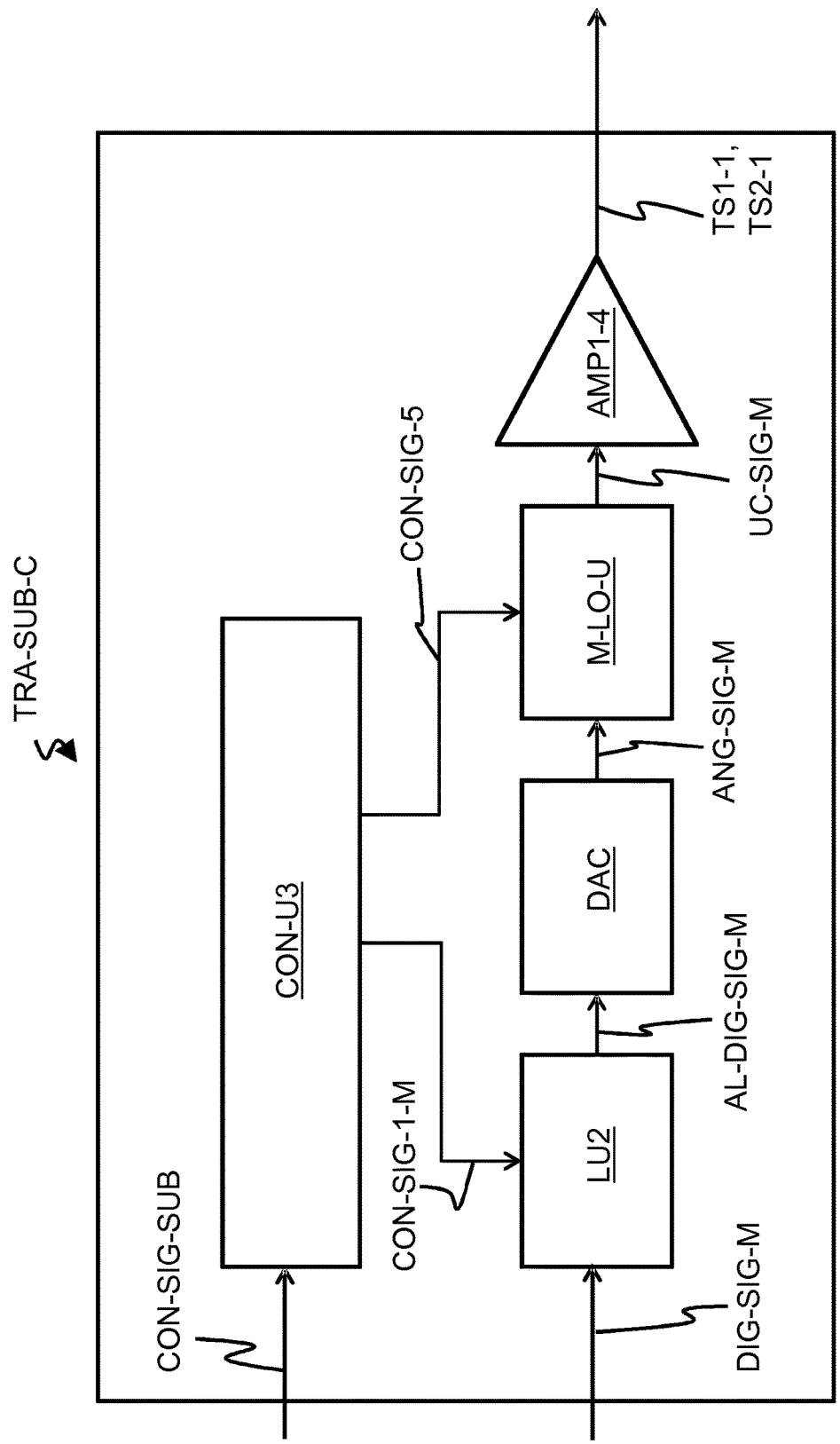
FIG. 9 shows schematically a block diagram of a transmitter subunit for providing first transmit signals in the first MIMO operation mode or at least second transmit signals in the at least second MIMO operation mode according to a third exemplary embodiment.

FIG. 9 shows an exemplarily embodiment, how this switching step S4-3 for obtaining the transmit signal TS with the predefined transmit power and the predefined frequency range may be realized by a transmitter subunit TRA-SUB-C. The elements in FIG. 9 that correspond to elements of FIG. 5 have been designated by same reference numerals. The transmitter subunit TRA-SUB-C may correspond to the transmitter subunits TRA-SUB1, TRA-SUB2, . . . , TRA-SUBN of the network node NN shown in FIG. 4 and contains a control unit CON-U3, a levelling unit LU2, the digital-to-analogue converter DAC, the modulator and local oscillator unit M-LO-U and a power amplifier AMP1-4. The power amplifier AMP1-4 may be for example a dual-band power amplifier.

Instead of a single carrier digital signal DIG-SIG a multi-carrier digital signal or a multi-band digital signal DIG-SIG-M may be applied to the levelling unit LU2.

When the control unit CON-U3 receives the control signal CON-SIG-SUB from the central control unit CCU, the control unit CON-U3 transmit a control signal CON-SIG-M to the levelling unit LU2 for levelling amplitude values of a first frequency subcarrier or a first frequency band to a first maximum value and for levelling amplitude values of at least one second frequency carrier or at least one second frequency band to at least one second maximum value and the levelling unit LU2 outputs an amplitude levelled signal AL-DIG-SIG-M. Thereby, the transmitter subunit TRA-SUB-C is adapted to transmit for example the first transmit signal TS1-1 with the first transmit power and the second transmit signal TS2-1 with the second transmit power.

The amplitude levelled signal AL-DIG-SIG-M is converted into an analogue signal ANG-SIG2 by the digital-to-analogue converter DAC to an analogue signal ANG-SIG-M.

Figure 10:
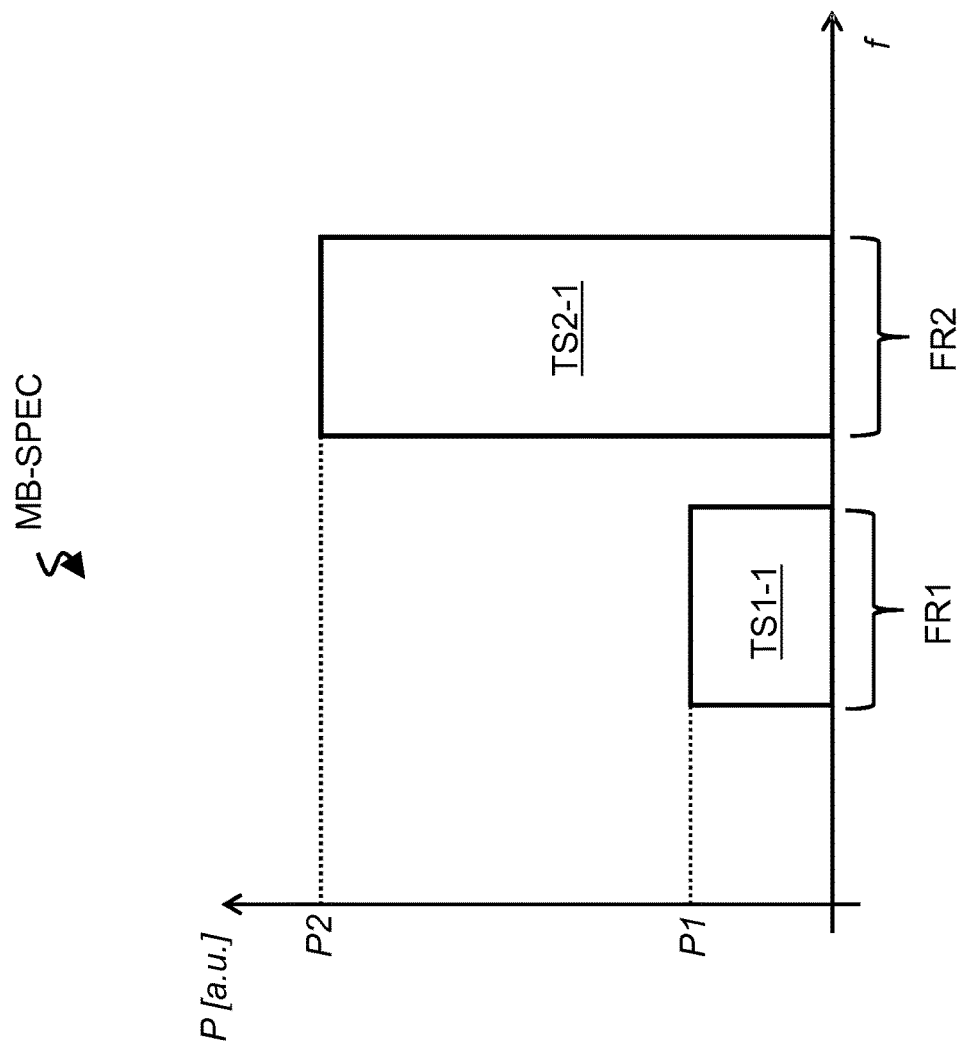
FIG. 10 shows a multi-band spectrum, which contains a first transmit signal with a first transmit power in a first frequency range and a second transmit signal with a second transmit power in a second frequency range according to an exemplary embodiment.

In addition, when the control unit CON-U3 is triggered by the control signal CON-SIG-SUB, the control unit CON-U3 transmits a further control signal CON-SIG-5 to the modulator and local oscillator unit M-LO-U for up-converting the analogue signal ANG-SIG-M to the predefined frequency ranges as required by the new operation mode. Thereby, the transmitter subunit TRA-SUB-C generates for example the first transmit signal TS1-1 and the second transmit signal TS2-1 as shown in FIG. 10 (see also FIG. 1). The first transmit signal TS1-1 is located in a first frequency range FR1 and has a first maximum transmit power P1 (in arbitrary units). The second transmit signal TS2-1 is located in a second frequency range FR2 and has a second maximum transmit power P2 (in arbitrary units), which is larger than the first maximum transmit power P1. The first frequency range FR1 may be for example a first subcarrier of an LTE PRB (PRB=Physical Resource Block) and the second frequency range FR2 may be for example a second subcarrier of the LTE PRB or of a further LTE PRB. Alternatively, the first frequency range FR1 may be for example a frequency carrier in the frequency range of 811 to 821 MHz and the second frequency range FR2 may be for example a further frequency carrier in the frequency range of 1710 to 1730 MHz.

Alternatively, the transmitter subunit TRA-SUB-C may generate more than two transmit signals with each transmit signal located in a separate frequency range and each transmit signal belonging to a different operation mode with a different transmit power. With respect to FIG. 1, the first transmit signals TS1-1, . . . , TS1-a, . . . , TS1-A may be transmitted in a first frequency range, the second transmit signals TS2-1, . . . , TS2-b, . . . , TS2-B may be transmitted in a second frequency range and the third transmit signals TS3-1, . . . , TS3-c, . . . , TS3-C may be transmitted in a third frequency range and each of the frequency ranges may for example cover a different area of the radio cell RC.

Figure 11:
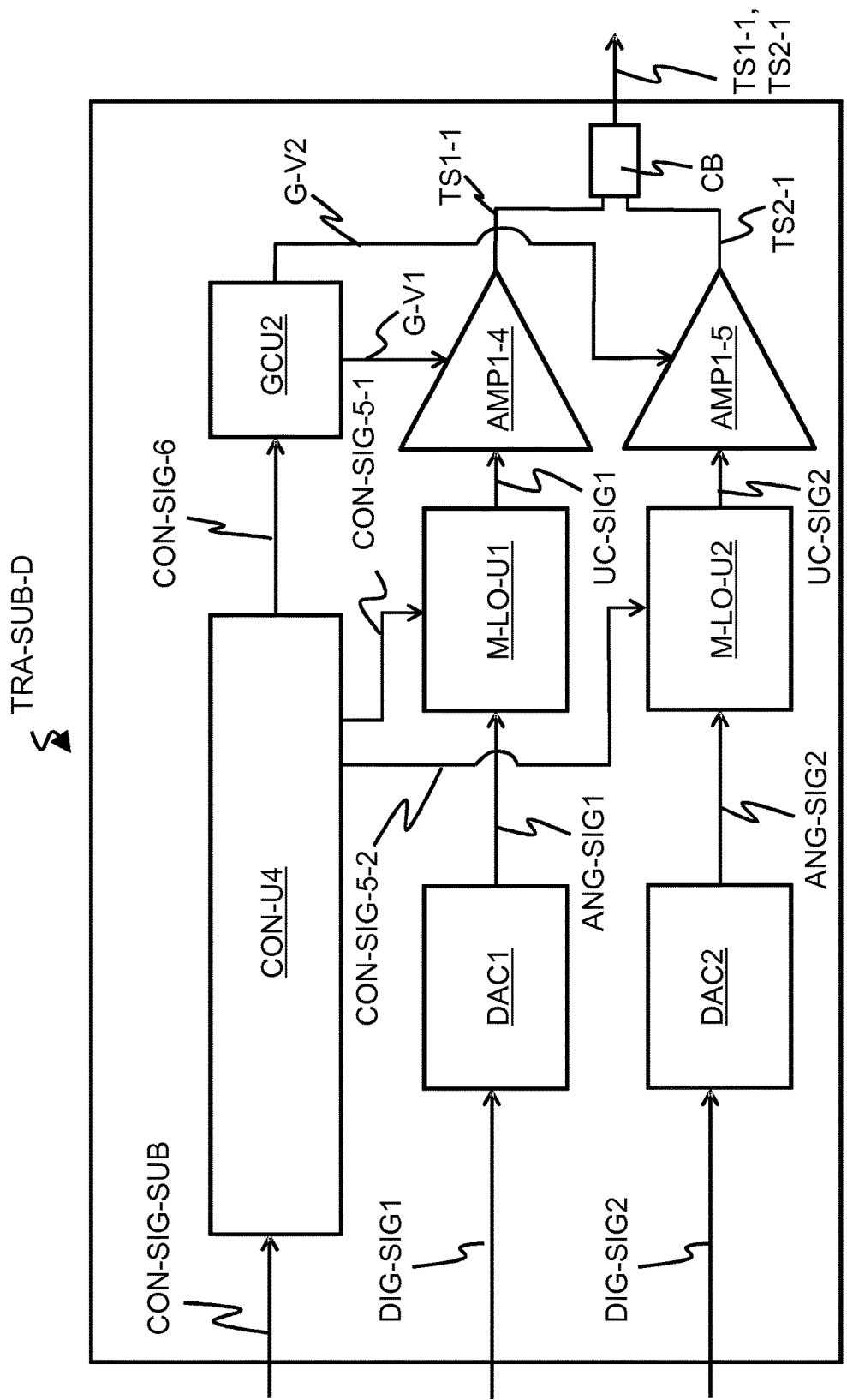
FIG. 11 shows schematically a block diagram of a transmitter subunit for providing first transmit signals in the first MIMO operation mode and at least second transmit signals in the at least second MIMO operation mode according to a fourth exemplary embodiment.

FIG. 11 shows schematically a further exemplarily embodiment for a transmitter subunit TRA-SUB-D being adapted to transmit a multicarrier spectrum or a multiband spectrum as shown in FIG. 10 with both frequency ranges FR1, FR2 simultaneously from a single antenna element of the massive MIMO antenna array AA shown in FIG. 4. The transmitter subunit TRA-SUB-D contains a control unit CON-U4, which is adapted to receive and to process the control signal CON-SIG-SUB. The transmitter subunit TRA-SUB-D further contains two separate processing paths with each containing a digital-to-analogue converter DAC1, DAC2, a modulator and local oscillator unit M-LO-U1, M-LO-U2 and a power amplifier AMP1-4, AMP1-5 for processing either a first digital signal DIG-SIG1 or a second digital signal DIG-SIG2. The transmitter subunit TRA-SUB-D further contains a gain control unit GCU2 for the amplifiers AMP1-4, AM P1-5.

The first digital signal DIG-SIG1 is converted into a first analogue signal ANG-SIG1 by a first digital-to-analogue converter DAC1, further up-converted to a first up-converted signal UC-SIG1 by a first modulator and local oscillator unit M-LO-U1 and amplified for example to the first transmit signal TS1-1 by a first power amplifier AMP1-4. In a same way, the second digital signal DIG-SIG2 is converted into a second analogue signal ANG-SIG2 by a second digital-to-analogue converter DAC2, further up-converted to a second up-converted signal UC-SIG2 by a second modulator and local oscillator unit M-LO-U2 and amplified for example to the second transmit signal TS2-1 by a second power amplifier AMP1-4.

When the control unit CON-U4 receives for example an instruction from the central control unit CCU to simultaneously operate a group of antenna elements of the massive MIMO antenna array AA in the first operation mode and the second operation mode with different frequency ranges for the transmit signals of both operation modes as shown in FIG. 10, the control unit CON-U4 may transmit a control signal CON-SIG-5-1 to the first modulator and local oscillator unit M-LO-U1 to up-convert the analogue signal ANG-SIG1 to the first frequency range FR1 and may further transmit a control signal CON-SIG-5-2 to the second modulator and local oscillator unit M-LO-U2 to up-convert the analogue signal ABG-SIG2 to the second frequency range FR2. In addition, the control unit CON-U4 may transmit a control signal CON-SIG-6 to the gain control unit GCU2 for instructing the gain control unit GCU2 to apply a first gain value G-V1 to the first power amplifier AMP1-4 for obtaining the first transmit signal TS1-1 with the first transmit power and to apply a second gain value G-V2 to the second power amplifier AMP1-5 for obtaining the second transmit signal TS2-1 with the second transmit power.

The transmitter subunit TRA-SUB-D further contains a combiner such as an RF combiner, a coupler or a directional coupler for combining the transmit signal TS-1-1 from the first processing path and the transmit signal TS2-1 from the second processing path for obtaining an overall output signal TS1-1, TS2-1 of the transmitter subunit TRA-SUB-D.

The description and drawings merely illustrate the principles of the invention. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

Functional blocks denoted as "means for transmitting", "means for receiving", "means for determining" etc. (performing a certain function) shall be understood as functional blocks comprising circuitry that is adapted for performing a certain function, respectively. Hence, a "means for s.th." may as well be understood as a "means being adapted or suited for s.th.". A means being adapted for performing a certain function does, hence, not imply that such means necessarily is performing said function (at a given time instant).

Functions of various elements shown in the figures, including any functional blocks may be provided through the use of dedicated hardware, as e.g. a processor, as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, DSP hardware, network processor, ASIC, FPGA, read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the detailed description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim. Such combinations are proposed herein unless it is stated that a specific combination is not intended. Furthermore, it is intended to include also features of a claim to any other independent claim even if this claim is not directly made dependent to the independent claim.

It is further to be noted that the first transmitter method MET1, the second transmitter MET2 and the third transmitter method MET3 disclosed in the specification or in the claims may be implemented by a device having means for performing each of the respective steps of these methods. Preferably, a computer program product may contain computer-executable instructions for performing one of the methods MET1, MET2, MET3, when the computer program product is executed on a programmable hardware device such as a DSP, an ASIC or an FPGA. Preferably, a digital data storage device may encode a machine-executable program of instructions to perform one of the methods MET1, MET2, MET3.

Further, it is to be understood that the disclosure of multiple steps or functions disclosed in the specification or claims may not be construed as to be within the specific order. Therefore, the disclosure of multiple steps or functions will not limit these to a particular order unless such steps or functions are not interchangeable for technical reasons. Furthermore, in some embodiments a single step may include or may be broken into multiple sub steps. Such sub steps may be included and part of the disclosure of this single step unless explicitly excluded.

The invention claimed is:

1. A transmitter method for operating a transmitter apparatus for multiple antenna systems and for serving mobile stations in a radio cell comprising:
operating at least one antenna array in a first operation mode by transmitting first transmit signals from a first number of antenna elements with a first transmit power; and
operating said at least one antenna array in at least one second operation mode by transmitting at least second transmit signals from at least one second number of antenna elements smaller than said first number of antenna elements with at least one second transmit power larger than said first transmit power;
wherein each of said first number of antenna elements is connected to a respective dedicated and separate transmitter subunit and said at least one second number of antenna elements is connected to an additional respective dedicated and separate transmitter subunit;
and further comprising switching between said first operation mode and said at least one second operation mode by selecting a first power amplifier of said transmitter subunit connected to said first number of antenna elements and optimized for an efficient operation with said first operation mode or selecting at least one second power amplifier of said transmitter subunit connected to said at least one second number of antenna elements and optimized for an efficient operation with said at least one second operation mode.

2. The transmitter method according to claim 1, wherein said at least one antenna array comprises said first number of antenna elements and wherein at least one further antenna array comprises said at least one second number of antenna elements or wherein antenna elements of said at least one antenna array and at least one further antenna array add to said first number of antenna elements and wherein antenna elements of one of said at least one antenna array or said at least one further antenna array add to said at least one second number of antenna elements.

3. The transmitter method according to claim 1, wherein said first number of antenna elements is a first group of antenna elements of said at least one antenna array and wherein said at least second number of antenna elements is at least one second group of antenna elements of said at least one antenna array.

4. The transmitter method according to claim 1, wherein said transmitter method further comprises switching between said first operation mode and said at least one second operation mode by adapting an output power of at least one power amplifier being connected to said first number of antenna elements and/or said at least one second number of antenna elements.

5. The transmitter method according to claim 4, wherein said adapting of said output power comprises adapting an amplitude level of an input signal of said at least one power amplifier of said transmitter subunit and/or adapting a gain of said at least one power amplifier of said transmitter subunit for obtaining said first transmit power or said at least one second transmit power.

6. The transmitter method according to claim 4, wherein said transmitter method further comprises simultaneously operating said at least one antenna array in said first operation mode by transmitting said first transmit signals in a first frequency range and operating said at least one antenna array in said at least one second operation mode by transmitting said at least one second transmit signals in at least one second frequency range different to said first frequency range.

7. The transmitter method according to claim 6, wherein said first operation mode is applied for data rates above a predefined threshold and wherein said at least one second operation mode is applied for basic signaling procedures and data rates below said predefined threshold.

8. The transmitter method according to claim 1, wherein said selecting comprises switching between an input of said first power amplifier and an input of said at least one second power amplifier and switching between an output of said first power amplifier and an output of said at least one second power amplifier both depending on a future operation in said first operation mode or in said at least one second operation mode.

9. The transmitter method according to claim 1, wherein said transmitter method further comprises evaluating at least one operating parameter and/or at least one transmission condition for selecting said first operation mode or said at least one second operation mode and wherein said at least one operating parameter or said at least one transmission condition is at least one of the following:
current data load of a coverage area served by said transmitter apparatus;
current channel condition of transmission channels between a network node of said transmitter apparatus and further network nodes;
current activity states of said further network nodes;
current buffer states at said network node for radio transmissions to said further network nodes;
current traffic types of data being transmitted via said transmission channels;
current battery state of said transmitter apparatus;
device types of said further network nodes;
current time of day;
current pre-defined rules for operating said transmitter apparatus;
current consumption of monthly data volume of said further network nodes;
subscription types of said further network nodes.

10. A transmitter apparatus for multiple antenna systems and for serving mobile stations in a radio cell comprising means for operating at least one antenna array in a first operation mode by transmitting first transmit signals from a first number of antenna elements with a first transmit power and for operating said at least one antenna array in at least one second operation mode by transmitting at least second transmit signals from at least one second number of antenna elements smaller than said first number of antenna elements with at least one second transmit power larger than said first transmit power;
wherein each of said first number of antenna elements is connected to a respective dedicated and separate transmitter subunit and said at least one second number of antenna elements is connected to an additional respective dedicated and separate transmitter subunit; and
wherein said transmitter apparatus is further adapted to switch between said first operation mode and said at least one second operation mode by selecting a first power amplifier of said transmitter subunit connected to said first number of antenna elements and optimized for an efficient operation with said first operation mode or selecting at least one second power amplifier of said transmitter subunit connected to said at least one second number of antenna elements and optimized for an efficient operation with said at least one second operation mode.

11. The transmitter apparatus according to claim 10, wherein said transmitter apparatus comprises a group of transmitter subunits adaptable to said first operation mode or to said at least one second operation mode.

12. A network node comprising a transmitter apparatus according to claim 10.

13. The network node according to claim 12, wherein said network node further comprises at least one antenna array connected to said transmitter apparatus and wherein said at least one antenna array is a massive MIMO antenna array.

14. The network node according to claim 13, wherein said network node further comprises a switch and wherein said switch is adapted to connect a group of transmitter subunits of said transmitter apparatus to a group of antenna elements of said massive MIMO antenna array or to antenna elements of a further antenna array.

\* \* \* \* \*